(12) United States Patent
Kim et al.

(10) Patent No.: US 12,076,971 B2
(45) Date of Patent: Sep. 3, 2024

(54) LAMINATED GLASS STRUCTURES FOR ELECTRONIC DEVICES AND ELECTRONIC DEVICE SUBSTRATES

(71) Applicant: CORNING INCORPORATED, Corning, NY (US)

(72) Inventors: Jin Su Kim, Seoul (KR); Dean Michael Thelen, Addison, NY (US)

(73) Assignee: CORNING INCORPORATED, Corning, NY (US)

( * ) Notice: Subject to any disclaimer, the term of this patent is extended or adjusted under 35 U.S.C. 154(b) by 1003 days.

(21) Appl. No.: 17/041,884

(22) PCT Filed: Mar. 27, 2019

(86) PCT No.: PCT/US2019/024388
§ 371 (c)(1),
(2) Date: Sep. 25, 2020

(87) PCT Pub. No.: WO2019/191302
PCT Pub. Date: Oct. 3, 2019

(65) Prior Publication Data
US 2021/0129486 A1    May 6, 2021

Related U.S. Application Data

(60) Provisional application No. 62/649,236, filed on Mar. 28, 2018.

(51) Int. Cl.
*B32B 7/027* (2019.01)
*B32B 17/06* (2006.01)
(Continued)

(52) U.S. Cl.
CPC .............. *B32B 7/027* (2019.01); *B32B 17/06* (2013.01); *C03C 3/087* (2013.01); *C03C 3/091* (2013.01);
(Continued)

(58) Field of Classification Search
CPC ........ B32B 17/06; B32B 7/02; H05K 1/0306; H05K 2201/017; H05K 2201/0191; H05K 2201/068
See application file for complete search history.

(56) References Cited

U.S. PATENT DOCUMENTS 4,130,680 A    12/1978  Ference et al.
2003/0151133 A1    8/2003  Kinayman et al.
(Continued)

FOREIGN PATENT DOCUMENTS

GB    2315266 A    1/1998
JP    11-340372 A    12/1999
(Continued)

OTHER PUBLICATIONS

Buch et al; "Design and Demonstration of Highly Miniaturized Low Cost Panel Level Glass Package for MEMS Sensors"; 2017 IEEE 67th Electronic Components and Technology Conference; 10 Pages.
(Continued)

*Primary Examiner* — Raj R Gupta
(74) *Attorney, Agent, or Firm* — Daniel J. Greenhalgh

(57) ABSTRACT

A laminated glass structure for an electronic device includes: a core glass layer having a first coefficient of thermal expansion (CTE); and a plurality of clad glass layers, each having a CTE that is lower than or equal to the first CTE of the core glass layer. A first of the clad glass layers is laminated to a first surface of the core glass layer and a second of the clad layers is laminated to a second surface of the core glass layer. Further, the total thickness of the core glass layer and the clad glass layers ranges from about 0.1 mm to about 3 mm. In addition, each of the first of the clad layers and the core glass layer comprises a loss tangent of 0.006 or less for signals having a frequency of 1 GHz to about 100 GHz.

17 Claims, 2 Drawing Sheets

(51) Int. Cl.
- *C03C 3/087* (2006.01)
- *C03C 3/091* (2006.01)
- *C03C 3/093* (2006.01)
- *C03C 4/18* (2006.01)
- *C03C 10/00* (2006.01)
- *C03C 21/00* (2006.01)
- *H05K 1/02* (2006.01)
- *H05K 1/03* (2006.01)

(52) U.S. Cl.
CPC ............... *C03C 3/093* (2013.01); *C03C 4/18* (2013.01); *C03C 10/0009* (2013.01); *C03C 10/0054* (2013.01); *H05K 1/024* (2013.01); *H05K 1/0306* (2013.01); *B32B 2307/30* (2013.01); *B32B 2307/732* (2013.01); *B32B 2457/00* (2013.01); *C03C 21/002* (2013.01); *C03C 2204/00* (2013.01); *H05K 2201/017* (2013.01); *H05K 2201/0191* (2013.01); *H05K 2201/068* (2013.01)

(56) References Cited

U.S. PATENT DOCUMENTS

| | | |
|---|---|---|
| 2008/0187730 A1 | 8/2008 | Nozaki et al. |
| 2013/0015180 A1* | 1/2013 | Godard ............... C03B 17/064 219/759 |
| 2014/0141217 A1* | 5/2014 | Gulati ............... C03B 23/20 428/375 |
| 2017/0205541 A1 | 7/2017 | Amin et al. |
| 2017/0305788 A1 | 10/2017 | Nikulin |

FOREIGN PATENT DOCUMENTS

| | | | |
|---|---|---|---|
| JP | 2000-178036 A | 6/2000 | |
| WO | WO-2016065118 A1 * | 4/2016 | ............ B32B 17/06 |
| WO | 2017/184414 A1 | 10/2017 | |

OTHER PUBLICATIONS

International Search Report and Written Opinion of the International Searching Authority; PCT/US2019/024388; Mailed Jun. 14, 2019; 10 Pages; Commissioner for Patents.

* cited by examiner

LAMINATED GLASS STRUCTURES FOR ELECTRONIC DEVICES AND ELECTRONIC DEVICE SUBSTRATES

CROSS-REFERENCE TO RELATED APPLICATION

This application claims the benefit of priority under 35 U.S.C. § 371 of International Application No. PCT/US2019/024388, filed on Mar. 27, 2019, which claims the benefit of priority under 35 U.S.C. § 119 of U.S. Provisional Application No. 62/649,236, filed Mar. 28, 2018, the content of which is incorporated herein by reference in its entirety.

FIELD

The present disclosure relates to laminated glass structures and, more particularly, to laminated glass structures and articles configured for electronic devices and electronic device substrates.

BACKGROUND

Digital technologies continue to expand, particularly in terms of data connectivity and processing rates. For example, processing rates on the order of 1 Gbits/s are expanding to rates on the order of tens of Gbits/s. The corresponding electronic device technology to achieve these data rates likely will result in an expansion of signal transmission and receiving frequencies on the order of 1 GHz to the order of tens of GHz (up to about 100 GHz).

As these signal frequencies increase to accommodate increase data processing rates, the technical specifications and requirements related to absorption loss associated with the insulating materials employed in these devices take on greater importance. For example, as these higher frequency communication signals are used in these devices, the signals must pass through various physical barriers that otherwise attenuate or block these signals. Examples of these physical barriers are electrically-insulating substrates that are used in the fabrication of electronic circuits such as antennas, semiconductor circuits and signal transmission structures. The intended function of these barriers encompasses various non-electrical requirements including, but not limited to, mechanical support, electrical isolation, providing one or more surfaces for deposition of metals and semiconducting materials, minimal thermal expansion and compaction, interconnect capability, a capacity for relatively low-cost manufacturing, and scalability with regard to length, width and/or thickness to accommodate various electronic device configurations.

Nevertheless, these barriers and substrates also play a role in the electrical performance of these electronic devices, particularly as the barriers and substrates are configured to handle signals with high frequencies or are in close proximity to electric fields having increased signal frequencies. In particular, these physical barrier materials are not perfect insulators and are therefore associated with dielectric loss that can affect the intensity of signals transmitted through them.

Accordingly, there is a need for structures suitable for electronic devices, electronic device substrates, and other comparable applications that can enable higher frequency communication in devices without a significant reduction in performance as it relates to other non-electrical device requirements.

SUMMARY

According to a first aspect, a laminated glass structure for an electronic device is provided that includes: a core glass layer having a first coefficient of thermal expansion (CTE); and a plurality of clad glass layers, each having a CTE that is lower than or equal to the first CTE of the core glass layer. A first of the clad glass layers is laminated to a first surface of the core glass layer and a second of the clad layers is laminated to a second surface of the core glass layer. Further, the total thickness of the core glass layer and the clad glass layers ranges from about 0.1 mm to about 3 mm. In addition, each of the first of the clad layers and the core glass layer comprises a loss tangent of 0.006 or less for signals having a frequency of 1 GHz to about 100 GHz.

According to a second aspect, the structure of aspect 1 is provided, wherein the first of the clad layers comprises a loss tangent of 0.003 or less for signals having a frequency of 1 GHz to about 100 GHz.

According to a third aspect, the structure of aspect 1 or aspect 2 is provided, wherein the core glass layer comprises a loss tangent of 0.003 or less for signals having a frequency of 1 GHz to about 100 GHz.

According to a fourth aspect, the structure of any one of aspects 1-3 is provided, wherein the total thickness of the core glass layer and the clad glass layers ranges from about 0.1 mm to about 1 mm.

According to a fifth aspect, the structure of any one of aspects 1-4 is provided, wherein each of the plurality of clad glass layers comprises an ion-exchangeable composition and a compressive stress region formed from an ion-exchange process.

According to a sixth aspect, the structure of any one of aspects 1-5 is provided, wherein each of the plurality of clad glass layers comprise a glass-ceramic composition.

According to a seventh aspect, an electronic device is provided that includes: an electronic device substrate; and a plurality of electronic components disposed on the substrate. The substrate comprises a laminated glass structure that includes: a core glass layer having a first coefficient of thermal expansion (CTE); and a plurality of clad glass layers, each having a CTE that is lower than or equal to the first CTE of the core glass layer. A first of the clad glass layers is laminated to a first surface of the core glass layer and a second of the clad layers is laminated to a second surface of the core glass layer. Further, the total thickness of the core glass layer and the clad glass layers ranges from about 0.1 mm to about 3 mm. In addition, the plurality of electronic components are disposed on the first of the clad layers and each of the first of the clad layers and the core glass layer comprises a loss tangent of 0.006 or less for signals having a frequency of 1 GHz to about 100 GHz.

According to an eighth aspect, the device of aspect 7 is provided, wherein the first of the clad glass layers comprises a loss tangent of 0.003 or less for signals having a frequency of 1 GHz to about 100 GHz.

According to a ninth aspect, the device of aspect 7 or aspect 8 is provided, wherein the core glass layer comprises a loss tangent of 0.003 or less for signals having a frequency of 1 GHz to about 100 GHz.

According to a tenth aspect, the device of any one of aspects 7-9 is provided, wherein the total thickness of the core glass layer and the clad glass layers ranges from about 0.1 mm to about 1 mm.

According to an eleventh aspect, the device of any one of aspects 7-10 is provided, wherein each of the plurality of clad glass layers comprises an ion-exchangeable composition and a compressive stress region formed from an ion-exchange process.

According to a twelfth aspect, the device of any one of aspects 7-11 is provided, wherein each of the plurality of clad glass layers comprise a glass-ceramic composition.

According to a thirteenth aspect, a laminated glass structure for an electronic device is provided that includes: a core glass layer having a first coefficient of thermal expansion (CTE); and a plurality of clad glass layers, each having a CTE that is lower than or equal to the first CTE of the core glass layer. A first of the clad glass layers is laminated to a first surface of the core glass layer and a second of the clad layers is laminated to a second surface of the core glass layer. Further, the total thickness of the core glass layer and the clad glass layers ranges from about 0.1 mm to about 3 mm and the thickness of the first of the clad glass layers is at least 0.05 mm. In addition, the first of the clad layers comprises a loss tangent of 0.006 or less for signals having a frequency of 1 GHz to about 100 GHz.

According to a fourteenth aspect, the structure of aspect 13 is provided, wherein the first of the clad glass layers comprises a loss tangent of 0.003 or less for signals having a frequency of 1 GHz to about 100 GHz.

According to a fifteenth aspect, the structure of aspect 13 or aspect 14 is provided, wherein each of the plurality of clad glass layers comprises an ion-exchangeable glass composition.

According to a sixteenth aspect, the structure of any one of aspects 13-15 is provided, wherein each of the plurality of clad glass layers comprises a glass-ceramic composition.

According to a seventeenth aspect, an electronic device is provided that includes: an electronic device substrate; and a plurality of electronic components disposed on the substrate. The substrate comprises a laminated glass structure that includes: a core glass layer having a first coefficient of thermal expansion (CTE); and a plurality of clad glass layers, each having a CTE that is lower than or equal to the first CTE of the core glass layer. A first of the clad glass layers is laminated to a first surface of the core glass layer and a second of the clad layers is laminated to a second surface of the core glass layer. Further, the total thickness of the core glass layer and the clad glass layers ranges from about 0.1 mm to about 3 mm and the thickness of the first of the clad glass layers is at least 0.05 mm. In addition, the plurality of electronic components are disposed on the first of the clad layers and the first of the clad layers comprises a loss tangent of 0.006 or less for signals having a frequency of 1 GHz to about 100 GHz.

According to an eighteenth aspect, the device of aspect 17 is provided, wherein the first of the clad glass layers comprises a loss tangent of 0.003 or less for signals having a frequency of 1 GHz to about 100 GHz.

According to a nineteenth aspect, the device of aspect 17 or 18 is provided, wherein each of the plurality of clad glass layers comprises an ion-exchangeable glass composition and a compressive stress region formed from an ion-exchange process.

According to a twentieth aspect, the device of any one of aspects 17-19 is provided, wherein each of the plurality of clad glass layers comprises a glass-ceramic composition.

Additional features and advantages will be set forth in the detailed description which follows, and in part will be readily apparent to those skilled in the art from the description or recognized by practicing the disclosure as exemplified in the written description and the appended drawings. It is to be understood that both the foregoing general description and the following detailed description are merely exemplary of the disclosure, and are intended to provide an overview or framework to understanding the nature and character of the disclosure as it is claimed.

The accompanying drawings are included to provide a further understanding of principles of the disclosure, and are incorporated in and constitute a part of this specification. The drawings illustrate one or more embodiment(s), and together with the description serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which.

DETAILED DESCRIPTION

Figure 1:
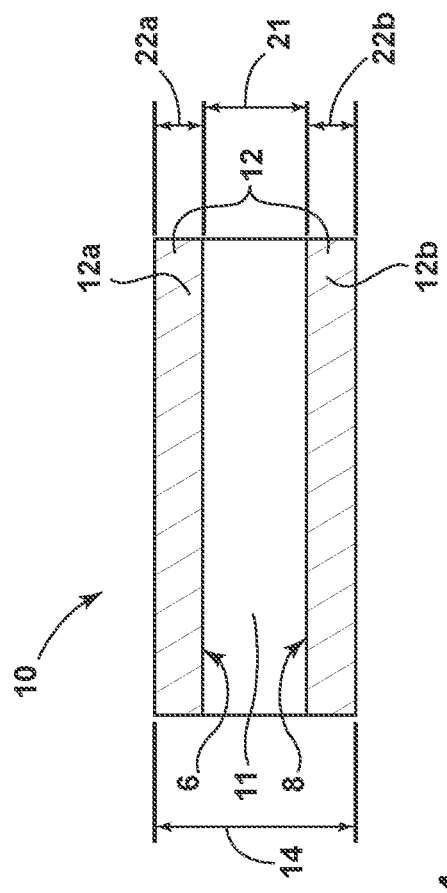
FIG. 1 is a cross-sectional, schematic view of a laminated glass structure, according to an example of the disclosure.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

The term "CTE," as used herein, refers to the coefficient of linear thermal expansion of a glass material, element or the like in the disclosure (e.g., a core glass layer) as averaged over a temperature range from 20° C. to 300° C. The CTE can be determined, for example, using the procedure described in ASTM E228 "Standard Test Method for Linear Thermal Expansion of Solid Materials With a Push-Rod Dilatometer" or ISO 7991:1987 "Glass—Determination of coefficient of mean linear thermal expansion."

The terms "relatively low CTE" and "low CTE" are used interchangeably in the disclosure with regard to clad glass layers with a starting glass composition (e.g., prior to drawing, laminating, and ion exchange) having a CTE that is lower than the CTE of the starting composition of the core glass by at least about $10 \times 10^{-7}/°$ C. The CTE of clad glass layers may also be lower than the CTE of the core glass layer by an amount in the range from about $10 \times 10^{-7}/°$ C. to about $70 \times 10^{-7}/°$ C., from about $10 \times 10^{-7}/°$ C. to about $60 \times 10^{-7}/°$ C., or from about $10 \times 10^{-7}/°$ C. to about $50 \times 10^{-7}/°$ C. For example, the core glass may have a CTE of about $100 \times 10^{-7}/°$ C. and the clad glass layers may have a CTE of about $50 \times 10^{-7}/°$ C., such that there is a difference of about $50 \times 10^{-7}/°$ C. between the CTE of the core glass and the clad glass layers.

The terms "thin glass" or "relatively thin glass" are used interchangeably in relation to laminated glass structures in the disclosure and intended to mean a laminated structure having a total thickness not exceeding about 3 mm.

The terms "mechanically strengthened glass laminate," "mechanically strengthened glass laminated structure" and "mechanical strengthening" are used in relation to the laminated glass structures of the disclosure to mean a glass laminate that has been formed by laminating a high CTE core glass to low CTE clad glass layer(s), thereby creating compressive stresses in the clad glass layers when the laminate is cooled following lamination. These compressive stresses can offset externally applied mechanical stresses (e.g., as applied through manufacturing-related handling, application-related loading and other sources), which have the net effect of strengthening the laminate.

The terms "chemically strengthened" and "chemical strengthening," as used in the present description, are intended to mean glass (e.g., a core glass layer, a clad glass layer, etc.) that has been strengthened using an ion exchange process, as understood by those with ordinary skill in the field of the disclosure, to create compressive stresses in the surface region of the glass at one or more of its primary surfaces and edges.

The terms "laminated glass structure," "laminated glass design," and "laminated glass article" are used in their broadest sense to include any object made wholly or partly of glass and/or glass-ceramic materials. Similarly, the terms "clad glass layer," "clad layer," "core glass layer," and "core layer" are used in their broadest sense to include such layers as made wholly or partly from glass and/or glass-ceramic compositions. For example, in some implementations of the laminated glass structures of the disclosure, the structure includes a core layer having a glass composition and a pair of clad glass layers having a glass-ceramic composition. Unless otherwise specified, all compositions are expressed in terms of mole percent (mol %). Further, coefficients of thermal expansion (CTE) associated with the features and elements of the disclosure are expressed in terms of $10^{-7}/°$ C. and represent a value measured over a temperature range from about 20° C. to about 300° C., unless otherwise specified.

The term "thickness weighted average dielectric constant $(D_k)$" refers to the dielectric constant of a laminated glass structure, design or article of the disclosure. In particular, the thickness weighted average dielectric constant $(D_k)$ of a laminated structure is calculated by multiplying the thickness of each layer of the laminated structure with its estimated or measured dielectric constant, summing the products for each of the layers, and then dividing the sum by the total thickness of the laminated glass structure.

The terms "loss tangent", "dielectric loss tangent" and "dielectric loss" are used interchangeably in this disclosure to refer to the inherent dissipation of electromagnetic energy (e.g., heat) afforded by a particular glass-ceramic composition, layer, or laminated structure associated with embodiments of this disclosure. The loss tangent can be parameterized in terms of either the loss angle $\delta$ or the corresponding loss tangent $\tan \delta$. Permittivity is the ability of a substance, such as the glass-ceramics of the disclosure, to store electrical energy in the presence of an external electric field. Further, terms "permittivity" and the "average dielectric constant $(D_k)$" are used interchangeably within this disclosure. Permittivity is a complex quantity because it describes the phase and magnitude of polarization in relation to an oscillating field. The terms "average dielectric constant $(D_k)$" and "relative permittivity $(\varepsilon_r)$" are used interchangeably in the disclosure and are defined as the ratio between the real part of the complex permittivity and permittivity of free space. The "loss tangent" is expressed as the ratio between the imaginary and real part of the complex permittivity. In general, the average dielectric constant and loss tangent of a material is dependent on the frequency of the external field. Therefore, the dielectric property measured in the kHz range may not represent the dielectric property at microwave frequencies. Further, unless otherwise noted, the "loss tangent" and "average dielectric constant $(D_k)$" attributes of the glass-ceramics of the disclosure can be measured at frequencies of 1 GHz or greater according to a split post dielectric resonator (SPDR) or an open-cavity resonator configuration according to techniques as understood by those with ordinary skill in the field of the disclosure. The particular method chosen can be selected based on the sample thickness and its lateral dimensions.

Disclosed herein are various laminated glass structures, designs and articles. Exemplary laminated glass articles in the disclosure are suitable for use in various electronic devices, including as configured more particularly for use as substrates in antenna, semiconductor circuit and signal transmission structures. These laminated structures can include a core glass layer and a plurality of clad glass layers, each laminated to the core glass layer and having a coefficient of thermal expansion (CTE) that is lower than or equal to the CTE of the core glass layer. In these structures, at least the first of the clad layers can comprise a loss tangent of 0.006 or less for signals having a frequency of 1 GHz to about 100 GHz. Further, the core glass layer can comprise a loss tangent of 0.006 or less for signals having a frequency of 1 GHz to about 100 GHz.

The laminated glass structures, designs and design approaches for electronic devices and vehicular applications that are described herein offer several advantages over conventional substrates. For instance, the laminated structures of the disclosure demonstrate improved signal loss performance over conventional substrate materials (e.g., FR4 glass fiber-reinforced epoxy composites), particularly at frequencies at or above 1 GHz. Accordingly, these laminated structures can play a significant factor in enabling electronic devices and related applications that make use of signals at high frequencies, e.g., 1 GHz or greater. A further advantage of these laminated glass structures is that they can be fabricated with particularly smooth surfaces that minimize surface roughness-related signal loss that can result from non-uniform deposition of typical semiconductor and metal materials employed in electronic devices. Another advantage of these laminated glass structures is that they can be significantly scaled upward in terms of surface area (e.g., length and width) and/or thickness to accommodate various electronic device configurations. In contrast, the ability to scale competing ceramic materials with low loss tangent characteristics is significantly more limited as the strength of ceramic materials is often limited by volume-dependent flaw size distributions. An additional advantage of these laminated glass structures is that they can be configured within a relatively large range of CTEs and compaction to match those of other materials and components in the devices employing them (e.g., deposited conductor traces, conductor vias and other interconnections). A further advantage of these structures is that they can be processed to accommodate through-thickness conductor vias, allowing for a range of interconnect options for the electronic devices employing these laminated structures. Relative to competing materials (e.g., ceramics) that can also offer low loss tangent properties, the laminated glass structures of this disclosure can be fabricated with lower manufacturing costs (e.g., through fusion draw techniques). Finally, another advantage of these laminated glass structures is that they can exhibit high mechanical strength, resulting from the development of compressive stress through the lamination of glass materials with dissimilar CTEs, which can be of benefit for some electronic device applications requiring high-strength substrates.

Referring now to FIG. 1, an exemplary, laminated glass structure 10 is provided according to an embodiment of the disclosure. The laminated structure 10 includes a core glass layer 11 having a thickness 21 and a first coefficient of thermal expansion (CTE); and a plurality of clad glass layers 12, each having a CTE that is lower than or equal to the first CTE of the core glass layer 11. A first of the clad layers 12a, having a thickness 22a, is laminated to a first surface 6 of the core glass layer. A second of the clad layers 12b, having a thickness 22b, is laminated to a second surface 8 of the core glass layer. Further, the total thickness 14 of the core glass layer 11 and the clad glass layers 12 ranges from about 0.1 mm to about 3 mm.

In some embodiments of the laminated glass structure 10 (see FIG. 1), the total thickness 14 is from about 0.1 mm to about 3 mm. In some implementations, the total thickness 14 of the laminated glass structure 10 does not exceed about 3 mm, or about 2.5 mm. Further, in some aspects, the total thickness 14 ranges from about 0.1 mm to about 3.0 mm, from about 0.15 mm to about 3 mm, from about 0.3 mm to about 3 mm, from about 0.1 mm to about 1 mm, from about 0.15 mm to about 2.5 mm, from about 0.3 mm to about 2.5 mm, or all thickness values between these values.

Referring again to the laminated glass structure 10 depicted in FIG. 1, the thickness 21 of the core glass layer 12 can range from about 0.01 mm to about 3 mm, from about 0.01 mm to about 2.5 mm, from about 0.01 mm to about 2 mm, from about 0.01 mm to about 1.5 mm, from about 0.1 mm to about 3 mm, from about 0.1 mm to about 2.5 mm, from about 0.1 mm to about 2 mm, from about 0.1 mm to about 1.5 mm, from about 0.2 mm to about 3 mm, from about 0.2 mm to about 2.5 mm, from about 0.2 mm to about 2 mm, from about 0.2 mm to about 1.5 mm, from about 0.3 mm to about 3 mm, from about 0.3 mm to about 2.5 mm, from about 0.3 mm to about 2 mm, and all values between these levels.

Still referring to the laminated glass structure 10 depicted in FIG. 1, the thicknesses 22a, 22b of the clad glass layers 12a, 12b can each range from about 0.01 mm to about 3 mm, from about 0.01 mm to about 2.5 mm, from about 0.01 mm to about 2 mm, from about 0.01 mm to about 1.5 mm, from about 0.1 mm to about 3 mm, from about 0.1 mm to about 2.5 mm, from about 0.1 mm to about 2 mm, from about 0.1 mm to about 1.5 mm, from about 0.2 mm to about 3 mm, from about 0.2 mm to about 2.5 mm, from about 0.2 mm to about 2 mm, from about 0.2 mm to about 1.5 mm, from about 0.3 mm to about 3 mm, from about 0.3 mm to about 2.5 mm, from about 0.3 mm to about 2 mm, and all values between these levels.

According to aspects of the laminated glass structure 10 depicted in FIG. 1, the thicknesses of the layers making up the structure can be configured such that a ratio of the thickness 21 of the core glass layer 11 to the total of the thicknesses 22a, 22b of the plurality of clad glass layers 12a, 12b is from about 0.05 to about 10, from about 0.1 to about 10, from about 2.5 to about 10, from about 2.5 to about 7.0, and all ratios between these values.

According to some aspects of the disclosure, the laminated glass structure 10 depicted in FIG. 1 can include a relatively high CTE core glass layer 11 and a relatively low CTE clad glass layer 12 laminated to each of the primary surfaces 6, 8 of the core glass layer 11. These relatively low CTE clad glass layers 12 can be laminated to the relatively high CTE core glass layer 11 by bonding the surfaces of the glass layers together at elevated temperatures such that the clad glass layers 12 fuse to the core glass layer 11. For example, an interface between each of the clad glass layers 12 and the core glass layer 11 are free of any bonding material such as, for example, an adhesive, a coating layer, or any non-glass material added or configured to adhere the respective clad layers to the core layer. Thus, each clad glass layer 12 is fused directly to the core glass layer 11 or is directly adjacent to the core glass layer. The laminated glass structure 10 is then allowed to cool. As the laminated glass structure 10 cools, the relatively high CTE core glass layer 11 contracts more than the relatively low CTE clad glass layers 12 that are securely bonded to the surfaces of the core glass layer 11. Due to the variable contraction of the core glass layer 11 and the clad glass layers 12 during cooling, the core glass layer 11 is placed in a state of tension (or tensile stress) and the clad layers 12 are placed in a state of compression (or compressive stress). This results in a mechanically strengthened, laminated glass structure 10 having a stress profile in which the compressive stress extends entirely through the clad glass layers 12. An advantageous, very deep depth of the compressive stress region (e.g., a depth-of-layer, "DOL") is thus formed in the laminated glass structure 10 (e.g., for electronic device applications requiring substrates in the form of these laminated glass structures with high strength and mechanical reliability). Compressive stresses ("CS") at the surface of the clad glass layers 12 can range from about 50 MPa to about 400 MPa, or from about 50 MPa to about 700 MPa, and other values between these ranges, as the result of mechanical strengthening.

According to embodiments of the laminated glass structure 10 (see FIG. 1), the plurality of clad glass layers 12 (i.e., one or more of the clad glass layers 12a, 12b) can be configured with a compressive stress region generated from an ion-exchange process; and can also be configured with an ion-exchangeable glass composition (e.g., a glass composition with one or more alkali metal ions, some of which may be exchanged with other alkali metal ions to develop residual compressive stresses). That is, the clad glass layers 12, before or after lamination with the core glass layer 11, can be configured with a compressive stress region to chemically strengthen the laminated glass structure 10 by virtue of the development of compressive stress in surface regions of the clad glass layers 12. More particularly, a compressive stress region is developed in the plurality of clad glass layers 12 such that compressive stress is present at the surface of the clad glass layers 12 and through a portion of the clad glass layers 12 to a particular depth. It should also be understood that the compressive stresses developed through chemical strengthening (e.g., an ion-exchange process) can be in addition to existing residual compressive stresses possessed by the clad glass layers 12 from mechanical strengthening (e.g., via CTE mismatch between the plurality of clad glass layers 12 and the core glass layer 11). Accordingly, the compressive stress created at the outer surfaces and near surface regions of the plurality of clad glass layers 12 can be comparable to or greater than what can otherwise be achieved by a chemical strengthening process alone.

In some implementations, the laminated glass structure 10 (see FIG. 1) is formed with compressive stresses from both a mechanical strengthening process (e.g., via CTE mismatch of the core and clad glass layers) and a chemical strengthening process (e.g., via an ion-exchange process), resulting in a deep compressive stress region. The resulting laminated glass structure 10 has a higher combined compressive stress (CS) and/or depth of compressive stress layer (DOL) than the CS and/or DOL levels that can be achieved using either mechanical or chemical strengthening processes alone. In some embodiments, the laminated glass structure 10 is subjected to mechanical strengthening through CTE mismatch of the core and clad glass layers 11, 12 such that each of the plurality of glass layers 12 has compressive stress (CS) at its outer surfaces of over 50 MPa, over 250 MPa, in a range from about 50 MPa to about 400 MPa, from about 50 MPa to about 300 MPa, from about 250 MPa to about 600 MPa, or from about 100 MPa to about 300 MPa. Further, in some embodiments, the laminated glass structure 10 is subjected to a chemical strengthening from an ion exchange process such that each of the plurality of clad glass layers 12 has a compressive stress region with a CS of 200 MPa or greater, 300 MPa or greater, 400 MPa or greater, 500 MPa or greater, 600 MPa or greater, 700 MPa or greater, 800 MPa or greater, 900 MPa or greater, a range from 200 MPa to about 1000 MPa, or from about 200 MPa to about 800 MPa. In embodiments of the laminated glass structure 10 subjected to both mechanical and chemical strengthening, each of the plurality of clad glass layers 12 can have a compressive stress (CS) at its outer surfaces as high as 700 MPa to 1000 MPa (e.g., about 300 MPa from mechanical strengthening and about 700 MPa from chemical strengthening).

Referring again to FIG. 1, the core glass layer 11 of the laminated glass structure 10 can be configured with a glass composition such that it has a CTE that is the same or higher than the CTE of each of the plurality of clad glass layers 12. For example, the core glass layer 11 can be formed from a glass composition which includes: from about 70 mol % to about 80 mol % $SiO_2$; from about 0 mol % to about 8 mol % $Al_2O_3$; from about 3 mol % to about 10 mol % $B_2O_3$; from about 0 mol % to about 2 mol % $Na_2O$; from about 10 mol % to about 15 mol % $K_2O$; and from about 5 mol % to about 6 mol % of alkaline earth oxide, wherein the alkaline earth oxide is at least one of CaO, SrO, and BaO without containing MgO. One example glass composition for the core glass layer 11 includes: 71.9 mol % $SiO_2$; 7.8 mol % $Al_2O_3$; 0.0 mol % $B_2O_3$; 10.1 mol % SrO; 0.1 mol % $SnO_2$; and 10.1 mol % BaO (also referred to as "Core P" in this disclosure, see also Table 1 below). Another example glass composition for the core glass layer 11 includes: 71.2 mol % $SiO_2$; 7.8 mol % $Al_2O_3$; 1 mol % $B_2O_3$; 10 mol % SrO; 0.1 mol % $SnO_2$; and 10 mol % BaO (also referred to as "Core Q" in this disclosure, see also Table 1 below). A further example composition for the core glass layer 11 includes: 67.0 mol % $SiO_2$; 21 mol % $B_2O_3$; and 13 mol % $P_2O_5$ (also referred to as "Clad GC C" in this disclosure, see also Table 2), which upon ceramming is a glass-ceramic as outlined in greater detail below. A further example glass composition for the core glass layer 11 is Corning® Eagle XG® glass.

According to another implementation of the disclosure, exemplary glass compositions suitable for the core glass layer 11 are provided below in Table 1 (identified as "Core A" through "Core 5"), along with average CTE values measured for each of them. It should also be understood that other glass compositions may also be used to form the core glass layer 11 of the laminated glass structure 10, provided that the average CTE of the core glass layer 11 is greater than or equal to the average CTE of each of the plurality of clad glass layers 12.

TABLE 1

Exemplary glass compositions for core layers of laminated glass structures

| (mol %) | Core A | Core B | Core C | Core D | Core E | Core F | Core G | Core H | Core I |
|---|---|---|---|---|---|---|---|---|---|
| $SiO_2$ | 61.2 | 65.7 | 63.3 | 64.9 | 61.9 | 64.54 | 67.9 | 29.8 | 71.5 |
| $Al_2O_3$ | 7.1 | 5.1 | 4.2 | 8.2 | 8.2 | 10.2 | 6.0 | 6.3 | 5.0 |
| CaO | 15.3 | 16.2 | 6.9 | 16.2 | 8.2 | 18.8 | 3.2 | 17.2 | 16.5 |
| BaO | 5.1 | 9.1 | 1.9 | 7.2 | 4.1 | 6.6 | 3.6 | 6.8 | 5.8 |
| SrO | 10.2 | 2.0 | 18.7 | 2.1 | 15.5 | 0.0 | 18.0 | 0.0 | 0.0 |
| $B_2O_3$ | 1.0 | 1.0 | 4.6 | 1.0 | 2.1 | 0.0 | 0.9 | 0.0 | 0.9 |
| MgO | 0.0 | 0.0 | 0.3 | 0.3 | 0.0 | 0.0 | 0.3 | 0.0 | 0.3 |

TABLE 1-continued

Exemplary glass compositions for core layers of laminated glass structures

| | | | | | | | | | |
|---|---|---|---|---|---|---|---|---|---|
| ZnO | 0.0 | 1.0 | 0.0 | 0.0 | 0.0 | 0.0 | 0.0 | 0.0 | 0.0 |
| $ZrO_2$ | 0.0 | 0.0 | 0.0 | 0.0 | 0.0 | 0.0 | 0.0 | 0.0 | 0.0 |
| $SnO_2$ | 0.0 | 0.0 | 0.0 | 0.0 | 0.0 | 0.0 | 0.0 | 0.0 | 0.0 |
| $Sb_2O_3$ | 0.0 | 0.0 | 0.0 | 0.0 | 0.0 | 0.0 | 0.0 | 0.0 | 0.0 |
| $Na_2O$ | 0.0 | 0.0 | 0.0 | 0.0 | 0.0 | 0.0 | 0.0 | 0.0 | 0.0 |
| Avg. CTE RT-300° C. (ppm) | 6.7 | 6.7 | 6.7 | 6.5 | 6.5 | 6.5 | 6.5 | 6.4 | 6.3 |

| (mol %) | Core J | Core K | Core L | Core M | Core N | Core O | Core P | Core Q | Core R | Core S |
|---|---|---|---|---|---|---|---|---|---|---|
| $SiO_2$ | 67.8 | 64.6 | 69.6 | 64.7 | 70.7 | 70 | 71.8 | 71.2 | 70.5 | 71.2 |
| $Al_2O_3$ | 6.0 | 10.6 | 6.7 | 9.1 | 5.1 | 7.7 | 7.8 | 7.7 | 7.7 | 7.7 |
| CaO | 3.1 | 18.2 | 18.0 | 17.0 | 3.0 | 3.1 | 0.1 | 0.1 | 0.1 | 0.2 |
| BaO | 3.7 | 6.6 | 5.7 | 4.9 | 1.7 | 5.6 | 10.1 | 9.9 | 9.8 | 9.8 |
| SrO | 18.0 | 0.0 | 0.0 | 3.1 | 17.2 | 10.6 | 9.9 | 9.8 | 9.7 | 9.6 |
| $B_2O_3$ | 1.0 | 0.0 | 0.0 | 0.9 | 2.0 | 1.9 | 0.0 | 0.9 | 1.9 | 1.1 |
| MgO | 0.3 | 0.0 | 0.0 | 0.3 | 0.3 | 0.6 | 0.0 | 0.0 | 0.0 | 0.0 |
| ZnO | 0.0 | 0.0 | 0.0 | 0.0 | 0.0 | 0.0 | 0.0 | 0.0 | 0.0 | 0.0 |
| $ZrO_2$ | 0.0 | 0.0 | 0.0 | 0.0 | 0.3 | 0.3 | 0.0 | 0.0 | 0.0 | 0.0 |
| $SnO_2$ | 0.0 | 0.0 | 0.0 | 0.0 | 0.0 | 0.1 | 0.1 | 0.1 | 0.1 | 0.1 |
| $Sb_2O_3$ | 0.0 | 0.0 | 0.0 | 0.0 | 0.0 | 0.1 | 0.0 | 0.0 | 0.0 | 0.0 |
| $Na_2O$ | 0.0 | 0.0 | 0.0 | 0.0 | 0.0 | 0.0 | 0.1 | 0.1 | 0.2 | 0.1 |
| Avg. CTE RT-300° C. (ppm) | 6.3 | 6.2 | 6.2 | 6.2 | 6 | 6.0 | 5.63 | 5.67 | 5.57 | 5.8 |

Referring again to FIG. 1, each of the plurality of clad glass layers 12 of the laminated glass structure 10 can be configured with a glass composition such that it has a CTE that is the same as or lower than the CTE of the core glass layer 11. For example, each of the clad glass layers 12a, 12b and/or the plurality of the clad glass layers 12 can be formed from a glass composition which includes: from about 65 mol % to about 70 mol % $SiO_2$; from about 9 mol % to about 14 mol % $Al_2O_3$; from about 0 mol % to about 11 mol % $B_2O_3$; from about 5 mol % to about 10 mol % alkali oxide $R_2O$, wherein R is at least one of Li, Na, and K; and from about 3 mol % to about 11 mol % of divalent oxide MO, wherein M is at least one of Mg, Ca, Ba and Zn. Another glass composition suitable for one or more of the plurality of clad glass layers 12 and/or the clad glass layers 12a, 12b includes: from about 65 mol % to about 68 mol % $SiO_2$; from about 10 mol % to about 13 mol % $Al_2O_3$; from about 6 mol % to about 9 mol % $B_2O_3$; from about 6 mol % to about 9 mol % alkali oxide $R_2O$, wherein R is at least one of Li, Na, and K; and from about 7 mol % to about 10 mol % of divalent oxide MO, wherein M is at least one of Mg, Ca, Ba and Zn. An example glass composition for the plurality of clad glass layers 12 and/or the clad glass layers 12a, 12b includes: 61.5 mol % $SiO_2$; 17.8 mol % $Al_2O_3$; 7.7 mol % $B_2O_3$; 1.7 mol % CaO; 6.7 mol % $Na_2O$; 4.1 mol % MgO; and 0.2 mol % $SnO_2$ (also referred to as "110PX" in this disclosure). It should also be understood that other glass compositions may also be used to form the plurality of clad glass layers 12 and/or the clad glass layers 12a, 12b of the laminated glass structure 10, provided that the average CTE of each of the clad glass layers 12, 12a, 12b is lower than or equal to the average CTE of the core glass layer 11.

According to an implementation of the laminated glass structures 10 depicted in FIG. 1, each of the plurality of clad glass layers 12 is configured with a glass-ceramic composition such that it has a CTE that is the same as or lower than the CTE of the core glass layer 11. For example, each of the clad glass layers 12a, 12b and/or the plurality of the clad glass layers 12 can be formed from a glass-ceramic composition which includes: from about 35 mol % to about 75 mol % $SiO_2$; from about 10 mol % to about 40 mol % $B_2O_3$; from about 10 mol % to about 40 mol % $P_2O_5$; and each of CaO, MgO and $Bi_2O_3$ from about 0 mol % to about 5 mol %. Further, these compositions can be cerammed by subjecting them to a nucleation heat treatment at 900° C. for 2 hours, followed by a crystal growth treatment at 1000° C. to 1100° C. for about 2 hours (i.e., to form a $B(PO_4)$ crystal phase). In addition, these glass-ceramic compositions exhibit an average CTE (25-300° C.) of 40-65×10$^{-7}$/° C., dielectric constants of about 4-5, and loss tangents between 10$^2$-10$^5$ Hz below 0.002. In one implementation, the clad glass layers 12 can be formed from a glass-ceramic composition which includes: from about 55 mol % to about 75 mol % $SiO_2$; from about 10 mol % to about 30 mol % $B_2O_3$; from about 10 mol % to about 35 mol % $P_2O_5$; and each of CaO, MgO and $Bi_2O_3$ from about 0 mol % to about 5 mol %. According to another implementation, exemplary glass-ceramic compositions for the clad glass layers 12 are provided below in Table 2 (identified as "Clad GC A" through "Clad GC I"), along with average CTE values measured for each of them and loss tangent values for a selection of them.

TABLE 2

Exemplary glass-ceramic compositions for clad layers of laminated glass structures

| (mol %) | Clad GC A | Clad GC B | Clad GC C | Clad GC D | Clad GC E | Clad GC F | Clad GC G | Clad GC H | Clad GC I |
|---|---|---|---|---|---|---|---|---|---|
| $SiO_2$ | 58.7 | 57.4 | 67.0 | 56.8 | 62.6 | 57.2 | 62.6 | 62.9 | 54.3 |
| $B_2O_3$ | 14.1 | 13.7 | 21.0 | 13.6 | 13.3 | 13.4 | 16.2 | 19.2 | 28.0 |

TABLE 2-continued

Exemplary glass-ceramic compositions for clad layers of laminated glass structures

| | | | | | | | | |
|---|---|---|---|---|---|---|---|---|
| P$_2$O$_5$ | 27.2 | 27.0 | 13.0 | 26.5 | 21.0 | 26.2 | 18.1 | 14.9 | 14.7 |
| CaO | 0.0 | 2.0 | 0.0 | 0.0 | 0.0 | 0.0 | 0.0 | 0.0 | 0.0 |
| MgO | 0.0 | 0.0 | 0.0 | 3.1 | 3.0 | 3.0 | 3.0 | 3.0 | 3.0 |
| Bi$_2$O$_3$ | 0.0 | 0.0 | 0.0 | 0.0 | 0.0 | 0.0 | 0.0 | 0.0 | 0.0 |
| SnO$_2$ | 0.0 | 0.0 | 0.0 | 0.09 | 0.10 | 0.10 | 0.09 | 0.10 | 0.09 |
| Avg. CTE RT-300° C. (ppm) | 5.53 | 5.88 | 4.28 | 5.34 | 4.89 | 4.34 | 4.45 | 4.34 | 4.57 |
| Loss tangent @ ~2.7 GHz | 0.00173 | 0.00116 | 0.00164 | 0.00142 | 0.00103 | *** | 0.00083 | *** | 0.00113 |
| Loss tangent @ ~5 GHz | 0.00304 | 0.00153 | 0.00286 | 0.00169 | 0.00125 | *** | 0.00098 | *** | 0.00184 |
| Loss tangent @ ~10 GHz | 0.00445 | 0.00248 | 0.00297 | 0.00218 | 0.00166 | *** | 0.00122 | *** | 0.00312 |

| (mol %) | Clad GC J | Clad GC K | Clad GC L | Clad GC M | Clad GC N |
|---|---|---|---|---|---|
| SiO$_2$ | 38 | 52.5 | 49.3 | 44.1 | 42.8 |
| B$_2$O$_3$ | 24.4 | 16.9 | 24.1 | 27.3 | 27 |
| P$_2$O$_5$ | 35.5 | 30.6 | 23.8 | 28.5 | 28.3 |
| CaO | 2.1 | 0.0 | 0.0 | 0.0 | 0.0 |
| MgO | 0.0 | 0.0 | 2.75 | 0.0 | 1.9 |
| Bi$_2$O$_3$ | 0.0 | 0.0 | 0.0 | 0.0 | 0.0 |
| SnO$_2$ | 0.0 | 0.0 | 0.0 | 0.0 | 0.0 |
| Avg. CTE RT-300° C. (ppm) | 5.11 | 4.83 | 5.29 | 5.48 | 5.69 |
| Loss tangent @ ~2.7 GHz | *** | 0.00173 | 0.00072 | 0.00077 | 0.00057 |
| Loss tangent @ ~5 GHz | *** | 0.00304 | 0.00094 | 0.00173 | 0.0080 |
| Loss tangent @ ~10 GHz | *** | 0.00445 | 0.00240 | 0.00509 | 0.00209 |

Referring again to FIG. 1, the laminated glass structure 10 can exhibit various properties that can enable higher frequency communication in devices without a significant reduction in performance as it relates to other non-electrical device requirements. For example, the laminated glass structure 10 can be configured such that one or more of the first of the clad glass layers 12a and the core glass layer 11 comprises a loss tangent, at a frequency of 1 GHz to about 100 GHz, of less than 0.01, from 0.01 to about 0.0005, from about 0.01 to about 0.001, less than 0.009, less than 0.008, less than 0.007, less than 0.006, less than 0.005, less than 0.004, less than 0.003 and all loss tangent values between these limits and endpoints. The laminated glass structure 10 can also be configured such that these loss tangent values are associated with one or more of the first of the clad glass layers 12a and the core glass layer 11 at frequencies of 2 GHz or greater, 2.7 GHz or greater, 3 GHz or greater, 4 GHz or greater, 5 GHz or greater, 6 GHz or greater, 7 GHz or greater, 8 GHz or greater, 9 GHz or greater, 10 GHz or greater, 20 GHz or greater, 30 GHz or greater, 40 GHz or greater, 50 GHz or greater, 60 GHz or greater, 70 GHz or greater, 80 GHz or greater, 90 GHz or greater, up to about 100 GHz, and all frequency values between these limits and endpoints. In some implementations, the second of the clad glass layers 12b is configured with these loss tangent values at the specified frequencies.

Figure 2:
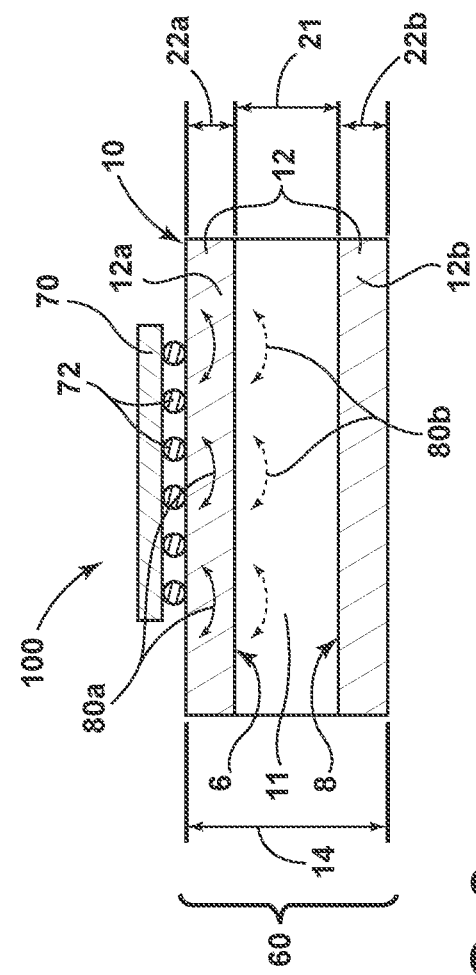
FIG. 2 is a cross-sectional, schematic view of an electronic device comprising a laminated glass structure, according to an example of the disclosure.

Referring now to FIG. 2, an electronic device 100 is depicted that comprises a laminated glass structure 10 (as shown in FIG. 1 and detailed in the corresponding description), according to an example of the disclosure. The electronic device 100 includes an electronic device substrate 60 and one or more electronic device components 70 (e.g., integrated circuits, antennae, transmission structures, etc.) that are disposed on the substrate 60. According to some embodiments, the electronic device components comprise one or more conductive traces 72. The substrate 60 comprises the laminated glass structure 10. As outlined earlier, the laminated structure 10 (see also FIG. 1) includes a core glass layer 11 having a thickness 21 and a first coefficient of thermal expansion (CTE); and a plurality of clad glass layers 12, each having a CTE that is lower than or equal to the first CTE of the core glass layer 11. A first of the clad layers 12a, having a thickness 22a, is laminated to a first surface 6 of the core glass layer. A second of the clad layers 12b, having a thickness 22b, is laminated to a second surface 8 of the core glass layer. Further, the total thickness 14 of the core glass layer 11 and the clad glass layers 12 ranges from about 0.1 mm to about 3 mm. In some implementations, as shown in FIG. 2, the electronic device components 70 are disposed on the first of the clad layers 12a. In other implementations (not shown), electronic device components 70 are disposed on each of the first and second clad layers 12a, 12b or the second of the clad layers 12b.

Referring again to FIG. 2, the electronic device 100, and particularly the laminated glass structure 10 and electronic device substrate 60, can exhibit various properties that can enable higher frequency communication in devices without a significant reduction in performance as it relates to other non-electrical device requirements. For example, the laminated glass structure 10 can be configured such that one or more of the first of the clad glass layers 12a and the core glass layer 11 comprises a loss tangent, at a frequency of 1 GHz to about 100 GHz, of less than 0.01, from 0.01 to about 0.0005, from about 0.01 to about 0.001, less than 0.009, less than 0.008, less than 0.007, less than 0.006, less than 0.005, less than 0.004, less than 0.003 and all loss tangent values between these limits and endpoints. The laminated glass structure 10 can also be configured such that these loss tangent values are associated with one or more of the first of the clad glass layers 12a and the core glass layer 11 at frequencies of 2 GHz or greater, 2.7 GHz or greater, 3 GHz or greater, 4 GHz or greater, 5 GHz or greater, 6 GHz or greater, 7 GHz or greater, 8 GHz or greater, 9 GHz or greater, 10 GHz or greater, 20 GHz or greater, 30 GHz or greater, 40 GHz or greater, 50 GHz or greater, 60 GHz or greater, 70 GHz or greater, 80 GHz or greater, 90 GHz or greater, up to about 100 GHz, and all frequency values between these limits and endpoints. In some implementations, the second of the clad glass layers 12b is configured with these loss tangent values at the specified frequencies.

According to an embodiment of the electronic device 100 depicted in FIG. 2, the laminated glass structure 10 and the electronic device substrate 60 can be configured to minimize loss associated with the electric fields 80a, 80b from the electronic device components 70. In particular, the laminated glass structure 10 is preferably configured such that the first of the clad layers 12a has a thickness 22a that exceeds the width of the one or more conductive traces 72. For example, the thickness 22a of the first of the clad layers 12a should be at least 0.05 mm for configurations in which the conductive traces 72 have a width of about 0.05 mm. In such configurations, the influence of the core glass layer 11 is minimized, allowing for laminated glass structure 10 configurations in which the loss tangent of the core glass layer 11 can exceed the loss tangent of the first of the clad layers 12a.

According to some embodiments, the laminated glass structure 10 shown in FIG. 1 is configured to maximize its signal transmission and/or minimize its signal loss tangent characteristics by minimizing its thickness weighted average dielectric constant ($D_k$). In some embodiments, the laminated glass structure 10 is also configured to ensure sufficient mechanical reliability for particular electronic device applications by employing ion-exchanged, clad glass layers 12 with a CTE that is lower than or equal to the CTE of the core glass layer 11. According to one exemplary embodiment, the laminated glass structure 10 employs a plurality of clad glass layers 12 formed from an ion-exchanged 110PX composition with a CTE of about $50\text{-}60\times10^{-7}/°$ C. and a $D_k$ of about 5.2; and a core glass layer 11 formed from an ion-exchanged Core P or Core Q composition with a CTE of about $50\text{-}60\times10^{-7}/°$ C. and a $D_k$ of about 4.5 to 5.0. According to another exemplary embodiment, the laminated glass structure 10 employs a plurality of clad glass layers 12 formed from a glass-ceramic composition (see, e.g., Clad GC A-I in Table 2) with an average CTE (25-300° C.) of $43\text{-}59\times10^{-7}/°$ C.; and a core glass layer 11 formed a glass composition (see, e.g., Core A-S in Table 1) with an average CTE (25-300° C.) of $55\text{-}68\times10^{-7}/°$ C.

Figure 3B:
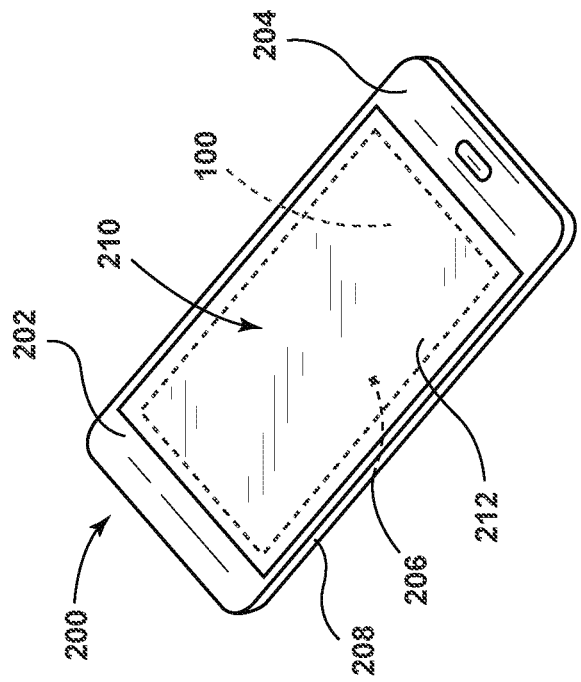
FIG. 3B is a perspective view of the exemplary electronic device of FIG. 3A.
Figure 3A:
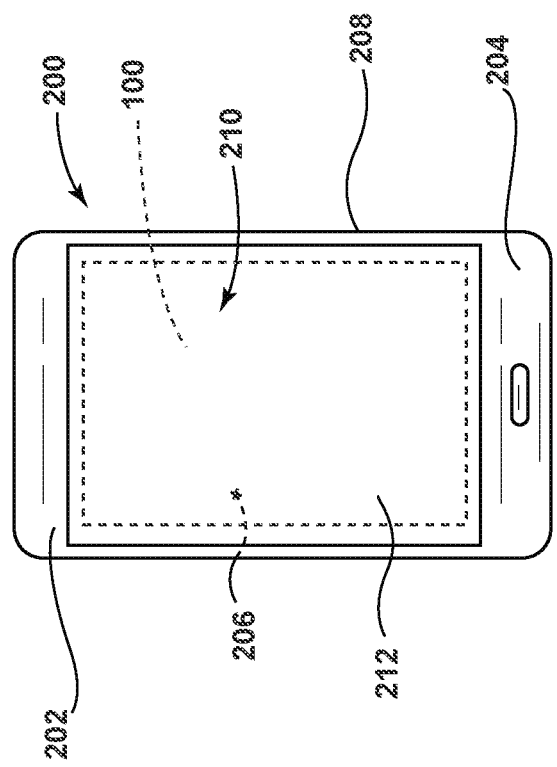
FIG. 3A is a plan view of an exemplary electronic device incorporating any of the laminated glass structures disclosed herein.

The laminated glass structures 10 and electronic device substrates 60 (see FIGS. 1 and 2) disclosed herein may be incorporated into various electronic devices 100 (see FIG. 2) such as a device article with a display (or display device articles) (e.g., consumer electronics, including mobile phones, tablets, computers, navigation systems, wearable devices (e.g., watches) and the like), augmented-reality displays, heads-up displays, glasses-based displays, architectural device articles, transportation device articles (e.g., automotive, trains, aircraft, sea craft, etc.), and appliance device articles. Similarly, the laminated glass structures 10 and electronic device substrates 60 can be incorporated into various electronic devices 100 (see FIG. 2) that can benefit from the signal loss characteristics associated with these structures, particularly at frequencies of 1 GHz or greater. An exemplary device article incorporating any of the articles disclosed herein (e.g., as consistent with the laminated glass structures 10 depicted in FIGS. 1 and 2) is shown in FIGS. 3A and 3B. Specifically, FIGS. 3A and 3B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. Further, the consumer electronic device 200 includes an electronic device 100 that comprises an electronic device substrate 60 (not shown) and laminated glass structure 10 (not shown). Accordingly, the consumer electronic device 200 depicted in FIGS. 3A and 3B employs an electronic device that comprises a laminated glass structure 10 (see FIGS. 1 and 2).

According to some embodiments, the electronic devices 100 and laminated glass structures 10 (see FIGS. 1 and 2) may be used in an optical element, such as a lens, windows, lighting covers, eyeglasses, or sunglasses, as integrated with an electronic display, electrically active device or other electronic components. In other embodiments, the electronic devices 100 and laminated glass structures 10 of the disclosure can be employed in vehicles, buildings and other applications in the form of electronic device substrates employed in components in these vehicles, buildings and the other applications.

It should be emphasized that the above-described embodiments of the present disclosure, including any embodiments, are merely possible examples of implementations, merely set forth for a clear understanding of various principles of the disclosure. Many variations and modifications may be made to the above-described embodiments of the disclosure without departing substantially from the spirit and various principles of the disclosure. More generally, all such modifications and variations are intended to be included herein within the scope of this disclosure and protected by the following claims.

What is claimed is:

1. A laminated glass structure for an electronic device, comprising:
    a core glass layer having a first coefficient of thermal expansion (CTE); and
    a plurality of clad glass layers, each having a CTE that is lower than or equal to the first CTE of the core glass layer,
    wherein a first of the clad layers is laminated to a first surface of the core glass layer and a second of the clad layers is laminated to a second surface of the core glass layer,
    wherein the total thickness of the core glass layer and the clad glass layers ranges from about 0.1 mm to about 3 mm, and
    further wherein each of the first of the clad layers and the core glass layer comprises a loss tangent of 0.006 or less for signals having a frequency of 1 GHz to 100 GHz.

2. The laminated glass structure according to claim 1, wherein the first of the clad glass layers comprises a loss tangent of 0.003 or less for signals having a frequency of 1 GHz to 100 GHz.

3. The laminated glass structure according to claim 1, wherein the core glass layer comprises a loss tangent of 0.003 or less for signals having a frequency of 1 GHz to 100 GHz.

4. The laminated glass structure according to claim 1, wherein the total thickness of the core glass layer and the clad glass layers ranges from about 0.1 mm to about 1 mm.

5. The laminated glass structure according to claim 1, wherein each of the plurality of clad glass layers comprises an ion-exchangeable composition and a compressive stress region formed from an ion-exchange process.

6. The laminated glass structure according to claim 1, wherein each of the plurality of clad glass layers comprises a glass-ceramic composition.

7. The laminated glass structure according to claim 1, wherein a compressive stress at a surface of each of the plurality of clad glass layers ranges from about 50 MPa to about 700 MPa.

8. An electronic device, comprising:
an electronic device substrate; and
a plurality of electronic components disposed on the substrate,
wherein the substrate comprises a laminated glass structure that comprises:
a core glass layer having a first coefficient of thermal expansion (CTE),
a plurality of clad glass layers, each having a CTE that is lower than or equal to the first CTE of the core glass layer,
wherein a first of the clad layers is laminated to a first surface of the core glass layer and a second of the clad layers is laminated to a second surface of the core glass layer,
wherein the total thickness of the core glass layer and the clad glass layers ranges from about 0.1 mm to about 3 mm, and
wherein the plurality of electronic components is disposed on the first of the clad layers, and further wherein each of the first of the clad layers and the core glass layer comprises a loss tangent of 0.006 or less for signals having a frequency of 1 GHz to 100 GHz.

9. The electronic device according to claim 8, wherein the first of the clad glass layers comprises a loss tangent of 0.003 or less for signals having a frequency of 1 GHz to 100 GHz.

10. The electronic device according to claim 8, wherein the core glass layer comprises a loss tangent of 0.003 or less for signals having a frequency of 1 GHz to 100 GHz.

11. The electronic device according to claim 8, wherein the total thickness of the core glass layer and the clad glass layers ranges from about 0.1 mm to about 1 mm.

12. The electronic device according to claim 8, wherein each of the plurality of clad glass layers comprises an ion-exchangeable composition and a compressive stress region formed from an ion-exchange process.

13. The electronic device according to claim 8, wherein each of the plurality of clad glass layers comprises a glass-ceramic composition.

14. An electronic device, comprising:
an electronic device substrate; and
a plurality of electronic components disposed on the substrate,
wherein the substrate comprises a laminated glass structure that comprises:
a core glass layer having a first coefficient of thermal expansion (CTE),
a plurality of clad glass layers, each having a CTE that is lower than or equal to the first CTE of the core glass layer,
wherein a first of the clad layers is laminated to a first surface of the core glass layer and a second of the clad layers is laminated to a second surface of the core glass layer,
wherein the total thickness of the core glass layer and the clad glass layers ranges from about 0.1 mm to about 3 mm and the thickness of the first of the clad glass layers is at least 0.05 mm, and
wherein the plurality of electronic components are disposed on the first of the clad layers, and further wherein the first of the clad layers comprises a loss tangent of 0.006 or less for signals having a frequency of 1 GHz to 100 GHz.

15. The electronic device according to claim 14, wherein the first of the clad layers comprises a loss tangent of 0.003 or less for signals having a frequency of 1 GHz to 100 GHz.

16. The electronic device according to claim 14, wherein each of the plurality of clad glass-ceramic layers comprises an ion-exchangeable composition and a compressive stress region formed from an ion-exchange process.

17. The electronic device according to claim 14, wherein each of the plurality of clad glass layers comprises a glass-ceramic composition.

* * * * *